United States Patent
Fujieda et al.

(10) Patent No.: US 6,818,821 B2
(45) Date of Patent: Nov. 16, 2004

(54) ELECTROMAGNETIC WAVE ABSORPTION MATERIAL AND AN ASSOCIATED DEVICE

(75) Inventors: Tadashi Fujieda, Mito (JP); Kishio Hidaka, Hitachiota (JP); Shinzou Ikeda, Tokai (JP); Mitsuo Hayashibara, Hitachinaka (JP); Noriyuki Taguchi, Yokohama (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 10/235,711

(22) Filed: Sep. 6, 2002

(65) Prior Publication Data

US 2003/0155143 A1 Aug. 21, 2003

(30) Foreign Application Priority Data

Feb. 15, 2002 (JP) ......................................... 2002-038237

(51) Int. Cl.[7] .................................................. H05K 9/00
(52) U.S. Cl. .................. 174/35 MS; 361/816; 174/36 R
(58) Field of Search ........................... 174/35 R, 35 MS (56) References Cited

FOREIGN PATENT DOCUMENTS

| JP | 7-212079 | 8/1995 |
|----|----------|--------|
| JP | 9-111421 | 4/1997 |
| JP | 11-16727 | 1/1999 |
| JP | 11-354973 | 12/1999 |
| JP | 2001-358493 | 12/2001 |
| RU | 2157256c2 | * 10/2000 |

* cited by examiner

*Primary Examiner*—Hung V. Ngo
(74) *Attorney, Agent, or Firm*—Dickstein Shapiro Morin & Oshinsky, LLP (57) ABSTRACT

An electromagnetic wave absorption material includes a dispersions of at least one of the materials: a multi-layer hollow globule of carbon, a schungite carbon, and the schungite ore; mixed into a matter having a high electrical resistivity. The invention is further characterized by an electronic device, an optical transmission module, an optical reception module, a high frequency telecommunication equipment, and a stop-free automated tollgate system, wherein at least a part of their board, electronic element, and circuit wiring are covered with said electromagnetic wave absorption material.

23 Claims, 9 Drawing Sheets

ELECTROMAGNETIC WAVE ABSORPTION MATERIAL AND AN ASSOCIATED DEVICE

BACKGROUND OF THE INVENTION

1. Field of the Invention

The present invention relates to a novel electromagnetic wave absorption material and associated devices. The invention relates to various articles particularly, such as, an electromagnetic wave absorption material for millimeter wave of 1 to 300 GHz band, a printed wiring board that uses such absorbing material, an electronic device, a casing for an electronic device, a module for optical transmission or reception, automated tollgate, and high frequency communication equipment.

2. Description of the Prior Art

In late years, the high speed processing in electronic devices is spreading at an accelerating pace together with rapidly raised operating frequency of ICs and LSIs in microprocessors. This raised frequency allows such devices to easily emit undesired noise.

Moreover, in the telecommunications field, the next-generation multimedia mobile communication (on 2 GHz), the wireless LAN (on 2 to 30 GHz), and the high-speed telecommunication network on the optical fiber are presently in use. Further, 5.8 GHz in ETC (an automated Electronic Toll Collection) system in ITS (Intelligent Transport System), 76 GHz in AHS (an advanced cruise-assist highway system) are also in use. Therefore, a rapid expansion of use-range toward higher frequencies is continuously anticipated.

Rise in frequency of a radio wave causes more eased emission in a form of noise. At the same time, narrowed noise margin in the recent electronic device because of lowered power consumption therein, together with poor quality in noise-ambient inside an apparatus because of miniaturization and dense mounting in the electronic device, brings a malfunctioning problem due to EMI (Electro-Magnetic Interference).

Under these circumstances, a measure such that a radio wave absorbing material is installed inside an electronic device is typically adopted to reduce EMI that will appear inside the device. One of radio wave absorbing materials so far used is a composite sheet of electrically insulating organic matters, such as rubber and resin, and magnetically lossy material, like soft magnetic metal oxides having spinel crystal structure and soft magnetic metals. These techniques were disclosed by Japanese Patent application laid-open No. 7-212079, 9-111421, 11-354973, 11-16727, etc.

However, the relative permeability of a soft magnetic metal oxide of spinel crystal structure sharply reduces in the GHz-band according to the Snoek's law of threshold This means that the usable frequency range for such metal oxide as an electromagnetic wave absorption material is up to several-GHz. In a soft magnetic metal on the other hand, its marginal frequency usable as a electromagnetic wave absorption material can be expanded up to about 10 GHz by use of eddy current suppression effect and shape-dependent magnetic anisotropy effect both yielded from making the particle therein into a flat-shape having a thickness thinner than the skin depth. However, such magnetic material prevents realization of light-weight electromagnetic wave absorber because of its inherent weightiness.

Japanese Patent application laid-open No. 2001-358493 has disclosed an integrated electromagnetic wave absorption material composed of particulate magnetic metal and ceramic, and those articles or facilities, which use said integrated absorption material, such as a printed wiring board, an electronic device, a casing for electronic device, an optical transmission or reception module, an automated tollgate, a high frequency telecommunication equipment, etc.

However, said magnetic material is still unsatisfactory in its electromagnetic wave absorption performance. Thus, development of an electromagnetic wave absorption material having an excellent performance in the extended use up to millimeter wave region is continuously desired. Although the electromagnetic wave absorption material according to said Japanese Patent application laid-open No. 2001-358493 is satisfactory for sub-millimeter wave region up to 5.8 GHz, the use in the millimeter wave region over such frequency does not satisfy with the performance of said material.

SUMMARY OF THE INVENTION

The purpose of the present invention is to provide an electromagnetic wave absorption material having an excellent radio wave absorbing performance usable spanning from sub-millimeter wave region to millimeter wave region in which radio wave frequency ranges from 1 to 300 GHz, and the one being easy to manufacture and light in weight. The purpose further includes to provide various appliances of and systems with said electromagnetic wave absorption material particularly an electronic device, an optical transmission or reception module, a high frequency telecommunication equipment, and a stop-free tollgate system which is prevented from malfunctioning due to electromagnetic wave interference.

The inventors of the present invention found that an electromagnetic wave absorption material comprised of a dispersions of multi-layer hollow globule of carbon mixed into electrical insulating organic material has a far more excellent performance as the electromagnetic wave absorption material available for use in millimeter wave region compared to an electromagnetic wave absorbing material relying on dielectric loss, i.e. a dispersions of carbon-based substance, such as carbon black particulate, graphite, coke, carbon microcoil, and carbon nanotube, mixed into electrical insulating organic material like rubber and resin. Since said multi-layer hollow globule of carbon or a multi-layer hollow globule of carbon existing in a natural schungite ore (hereinafter referred to as a schungite carbon) is contained in natural schungite ore, the use such material for the electromagnetic wave absorption material sees little difficulty. Particularly, the present invention is devised based on the finding that such globule has a high absorption property in millimeter wave region of which frequencies are 30 to 300 GHz.

The schungite carbon for this purpose is preferred to have 1.5 to 45% of porosity, 0.15 to 0.25 nm of thickness, and to have a shape being spherical or flat, or their mix. As for the natural schungite ore, preferred contents is 25 to 35% of the schungite carbon, 57 to 67% $SiO_2$, 3 to 5% $AlO_3$, 1 to 3% $Fe_2O_3$+FeO, 0.5 to 2% $K_2$, 0.2 to 1.0% sulfur, 0.2 to 0.5% free water, and 0.3% or less for each of $TiO_2$, MgO, CaO, $Na_2O$, and MnO.

The present invention is characterized by an electromagnetic wave absorption material that includes: one of a multi-layer hollow sphere (globule) of carbon and a schungite carbon; or one of a multi-layer hollow sphere and a schungite carbon, said multi-layer hollow sphere containing at least one of a carbon nanotube, a metallic component, and free water; or a schungite ore otherwise.

The electromagnetic absorption material in the present invention is preferred to be a dispersions mixed into a substance that has a higher electrical resistance than that of multi-layer hollow globule or the schungite carbon. In this dispersing, the quantity of the multi-layer hollow globule and the schungite carbon is preferred to be in a range of 5 to 50% of the weight of such high-resistance substance. This high-resistance substance is preferred to be selected among from rubber, insulation high polymer, and insulating inorganic material.

The electromagnetic wave absorption material in the present invention prefers a configuration wherein content of the multi-layer hollow globule or the schungite carbon is graded to plural degrees so that characteristic impedance may reduce toward inside from the incident plane of electromagnetic wave. Thereby, the electromagnetic wave absorbing performance for an oblique incidence of electromagnetic wave is improved or becomes being capable of accommodating electromagnetic wave of wide range of frequencies.

Material having a high electrical resistivity can contain at least one of: a magnetic metal of which main constituent is at least one of iron (Fe), cobalt (Co), and nickel (Ni); a compound selected from the group consisting of an oxide, a nitride, and a carbide, in which their main constitution is at least one of iron (Fe), cobalt (Co), nickel (Ni), aluminum (Al), silicon (Si), titanium (Ti), barium (Ba), manganese (Mn), zinc (Zn), and magnesium (Mg); and a carbon-based substance which contains at least one of carbon black, graphite, coke, and carbon microcoil. Thereby the absorbing performance of the electromagnetic wave absorption material is more improved.

The present invention is characterized by an electromagnetic wave absorption material comprising an electromagnetic wave absorbing particulate and a substance that has an electrical resistivity higher than said electromagnetic wave absorbing particulate, wherein the return loss (reflection coefficient) of said electromagnetic wave absorption material is −3.5 dB or more (in absolute value) at a radio wave frequency of 1 GHz and the return loss of the same is −20 dB or more at a radio wave frequency of 6 GHz. Said electromagnetic wave absorbing particulate prefers to be comprised of said electromagnetic wave absorption material. Such return loss levels can be attained by regulating combination of thickness of said electromagnetic wave absorption material and content of said electromagnetic wave absorbing particulate in a composite.

The electromagnetic wave absorption material by the present invention can be applied to a broad range of articles typically listed below through various suited methods depending on each article. Said absorption material is applied in a form of dispersions mixed in said insulating material for coating or for sheeting to glue, or in a style of a near net shape by injection molding.

(1) A printed wiring board in which all or a part of at least one of surfaces of said wiring board, one wired surface and the other the reverse surface thereof which has no circuit wiring, is covered with a layer of direct coating or a sheet-formed film each comprised of the electromagnetic wave absorption material by the present invention.

(2) An electronic device in which an electronic element mounted thereon is covered with a cap that has the electromagnetic wave absorption material by the present invention.

(3) An electronic device in which a printed wiring board thereof and an electronic element mounted on said printed wiring board is covered with a casing having the electromagnetic wave absorption material by the present invention, or in which the internal surface of a metal casing having an opening is provided with the electromagnetic wave absorption material by the present invention.

(4) A module for optical transmission or optical reception in which at least either a light emitting element thereof or a photo acceptance element thereof, each of which has an opt-electric conversion device for use in a high-speed telecommunication networks, and at least either a transmission circuitry therein or a reception circuitry therein are covered with the member that is equipped with the electromagnetic absorption material described by the present invention.

(5) An automated tollgate comprising a roofed tolling gate, an entrance antenna arranged at the entrance of said tolling gate and faced to a transit vehicle approaching said tolling gate, an exit antenna arranged at the exit of said tolling gate and faced to a transit vehicle leaving said tolling gate, and an automated toll collection system that exchanges information between a roadside communication equipment and an on-vehicle equipment carried by said transit vehicle, wherein the surface of a structural member in said tolling gate and its vicinity which reflects electromagnetic wave, the surface of facing-to-vehicle side of the roof of said tolling gate, and at least a part of the surface of a supporting column for said entrance antenna and said exit antenna are provided with the electromagnetic wave absorption material described by the present invention.

(6) A high frequency communication equipment comprising a mounted high frequency circuit element and an antenna both accommodated inside a casing, wherein at least the inner wall of said casing, and at least a part said inner wall, are provided with the electromagnetic wave absorption material described by the present invention.

According to the present invention, it is practicable to provide an economical electromagnetic wave absorption material having far more excellent performance in absorbing property than that in a dielectric loss type electromagnetic wave absorbing material in the prior art comprised of carbon-based material.

Further according to the present invention, electromagnetic wave interference within an electronic device is efficiently suppressed by use of a light weight electromagnetic wave absorption material having an absorbing property usable from submillimeter wave region to millimeter wave region. Thus, it becomes practicable to provide equipment acceptable for use in a high speed telecommunication network, such as semiconductor device, an optical transmission module, an optical reception module, or an optical transmission-reception module, and high frequency telecommunication equipment; thanks to their capability rendered from the absorbing material of suppressing internal noise interference and noise emission to outside, of achieving small-sizing and weight-reduction, of working under high speed transmission, and of having high sensitivity.

Moreover according to the present invention, it also becomes practicable to provide an automated tollgate capable of exchanging information between a roadside communication equipment and an on-vehicle equipment free from suffering electromagnetic wave interference.

DESCRIPTION OF THE PREFERRED EMBODIMENT

Embodiment 1

Figure 1A:
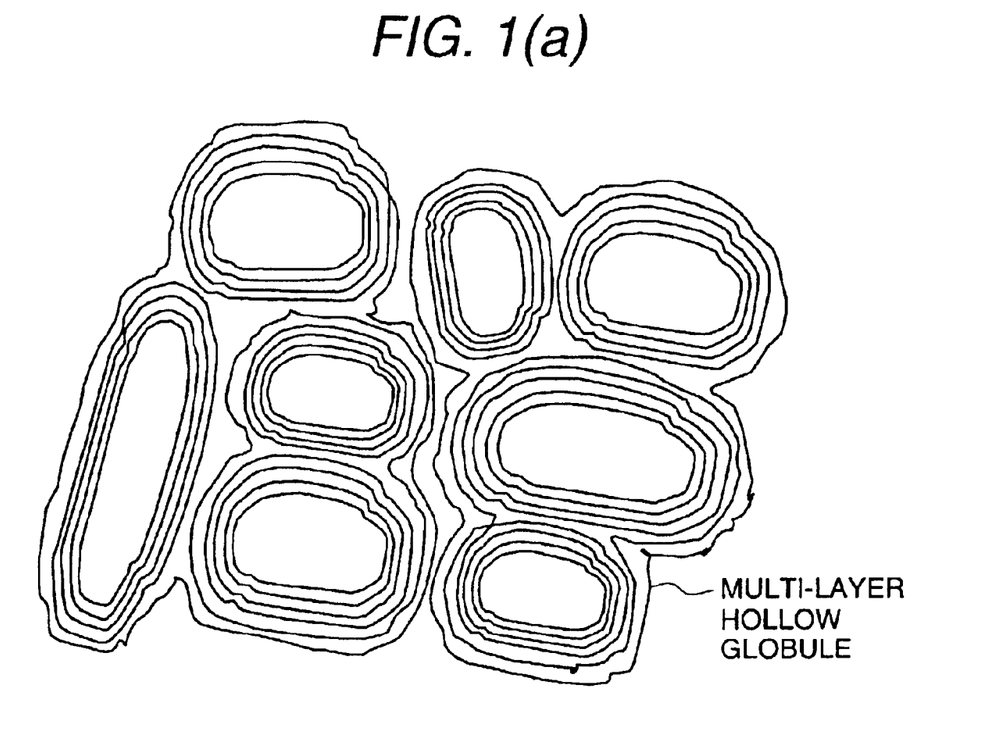
FIG. 1 is a pattern diagram for schungite carbon that comprises the electromagnetic wave absorption material by the present invention.
Figure 1B:
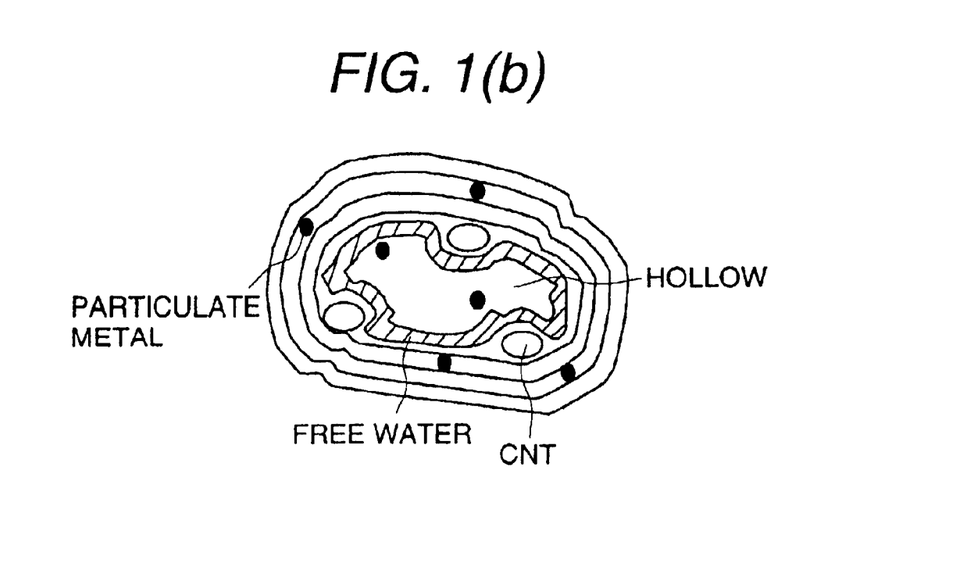

FIG. 1 is a pattern diagram of the schungite carbon, being contained in a natural schungite ore, which is composed of a multi-layer small hollow sphere of carbon called a globule. As shown in FIG. 1(b), the globule contains, inside thereof, a small quantity of a carbon nanotube (CNT), metals (Cu, Ni, V, Cr, Co, Mn, and Ti), and free water. These metals exist there in a form of silicate, sulfide, and oxide. The natural schungite ore contains 28 to 32% of the schungite carbon in weight ratio together with 57 to 66% of $SiO_2$, 3 to 5% of $Al_2O_3$, 1 to 3% of $Fe_2O_3$+FeO, 0.5 to 2% of $K_2O$, 0.2 to 1.0% of sulfur, 0.2~0.5% of free water, and 0.3% or less for the lump of $TiO_2$, MgO, CaO, $Na_2O$, and MnO.

Figure 2A:
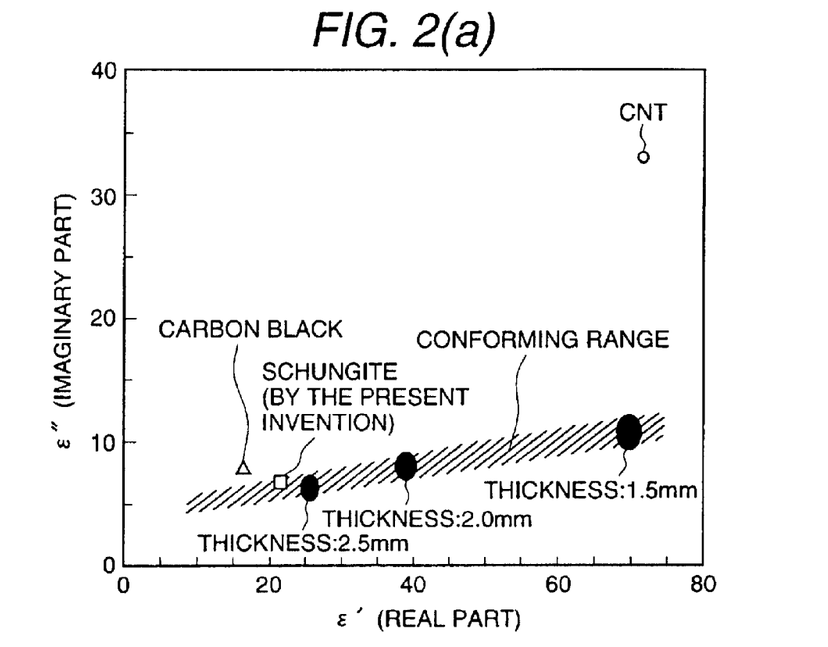
FIG. 2 is a graph to show complex relative dielectric constants of electromagnetic wave absorption materials by the present invention and by a comparative example, and the conforming range of a complex relative dielectric constant.
Figure 2B:
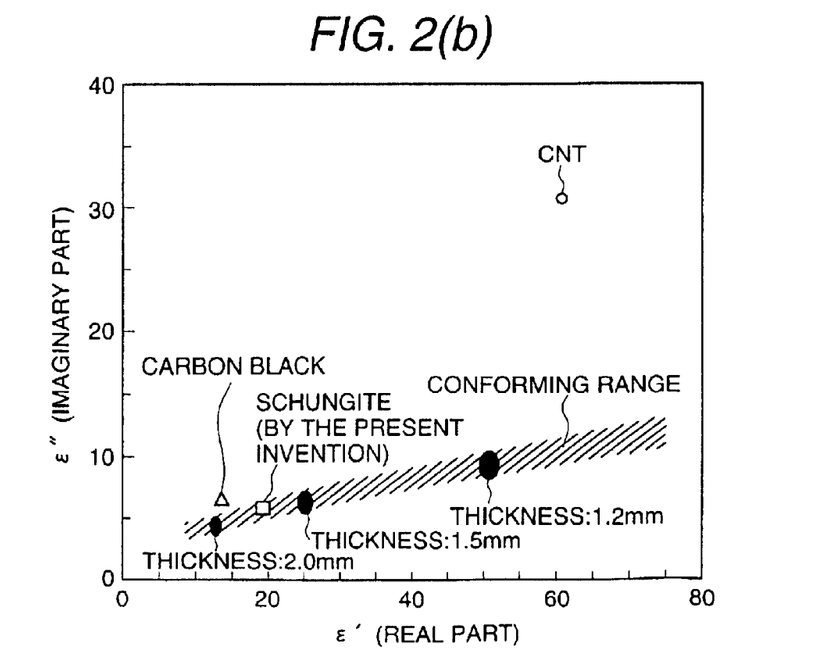

FIG. 2 graphs the relative dielectric constant of the sheet-shaped electromagnetic wave absorption material for a range of frequencies. Said sheet of absorbing material was prepared using: a carbon black (hereinafter abbreviated to CB) and a carbon nanotube (hereinafter abbreviated to CNT), each 20-part by weight to a binder resin, and a natural schungite ore, ground into powders of 1 to 30 μm in sizes (hereinafter referred to as a schungite) 70-part by weight to a liquid binder resin (wherein the weight ratio of the schungite to the binder resin is about 20-part). These materials are mixed and kneaded into a paste, then sheeted by the doctor blade method or by the roll-forming method. The schungite carbon is 3 nm in internal diameter of its hollow and about 22.5 nm in external diameter.

In the figure, (a) is for property at 6 GHz and (b) is for the one at 10 GHz; each frequency belongs to the millimeter wave region. Shaded area in the graph shows a range such that the return loss of a complex relative dielectric constant is −20 dB or more. As can be understood from these, the complex relative dielectric constant of the schungite falls in a conforming range at every frequency examined. In contrast to this, CB and CNT show the imaginary part of the complex dielectric constant ($\in'$) is too large compared with the real part of that ($\in''$) to fall in the conforming range and some return losses (reflection coefficients) of them are less than −20 dB. The range of complex relative dielectric constant that satisfies the return loss being not less than −20 dB which characterizes the present invention is the range such that, at both the frequencies of 6 GHz and 10 GHz, a value of 10 in the real part ($\in'$) corresponds to values of 4 to 6 in the imaginary part ($\in''$) and such that values of 75 in the real part ($\in'$) correspond to values of 10 to 13 in the imaginary part ($\in$).

For the use as a paint form, application methods by spraying, dipping, and casting may be applicable for forming after preparation of said paste.

Usable materials as the binders are: polyester-based resin, polyvinyl chloride-based resin, polyvinyl butyral resin, polyurethane resin, cellulose-based resin, and copolymer of these resin; epoxy resin, phenol resin, amide-based resin, imide-based resin, nylon, acrylic resin, synthetic rubber, and other similar polymeric insulating material; and inorganic insulating material of which main constituent is alumina, silica, or the like. In this embodiment, a resin-mix of acrylic and polyamide is used as the binder.

A refined schungite carbon alone may be used, wherein said refined carbon is obtained by dissolving mineral constituents other than the schungite carbon contained in the natural schungite ore using such as hydrofluoric acid. Contrary to this manner, it is acceptable, for improved electromagnetic wave absorbing performance, to make the schungite carbon support magnetism metallic particle which includes at least one of Fe, Co, and Ni.

The schungite carbon contained in a ground powder of the natural schungite has a structure of a broken globule having a spore-like shape as shown in FIG. 1; matters such as CNT, usually found inside the structure, exist independently of the globule. Artificially produced carbon being given the same structure as the natural schungite may bring the same effects. It is also acceptable to heat treat the ground powder of the natural schungite in inert gas atmosphere to alter the complex relative dielectric constant thereof for improved electromagnetic wave absorption performance. The preferred temperature in such treatment is 500 to 1000° C.

The complex relative dielectric constant was measured with a measuring system comprised of the network analyzer (by HP 8720 C) and a coaxial line. Calibrating the system so that both the measured permeability and dielectric constant of the free space may equal to 1, placing the test specimen in the coaxial line, and measuring parameters $S_{11}$ and $S_{21}$ using two ports; then the relative dielectric constant was obtained using Nicolson-Ross and Weir Method.

The absorption mechanism in a metal-backed electromagnetic wave absorber of a matched type may include a multi-path reflection effect produced by the critical coupling between the surface reflected wave and the multiple reflected wave generated in the absorber, and attenuation effect caused from the dielectric loss within the absorber. Generally, the return loss (R.L., in dB) for a normal incidence is expressed by the below described equations (1) and (2).

$$R.L. = -20\log|Z_{in}-1/Z_{in}+1| \quad (1)$$

(where $Z_{in}$: characteristic impedance of the absorber)

$$Z_{in} = (1/\in_r)^{0.5} \tanh(j2\pi ft \in_r^{0.5}) \quad (2)$$

(where $\in_r$: complex dielectric constant ($\in_r = \in' + j \in''$), f: frequency (Hz), t: thickness (m) of the absorber).

Figure 3A:
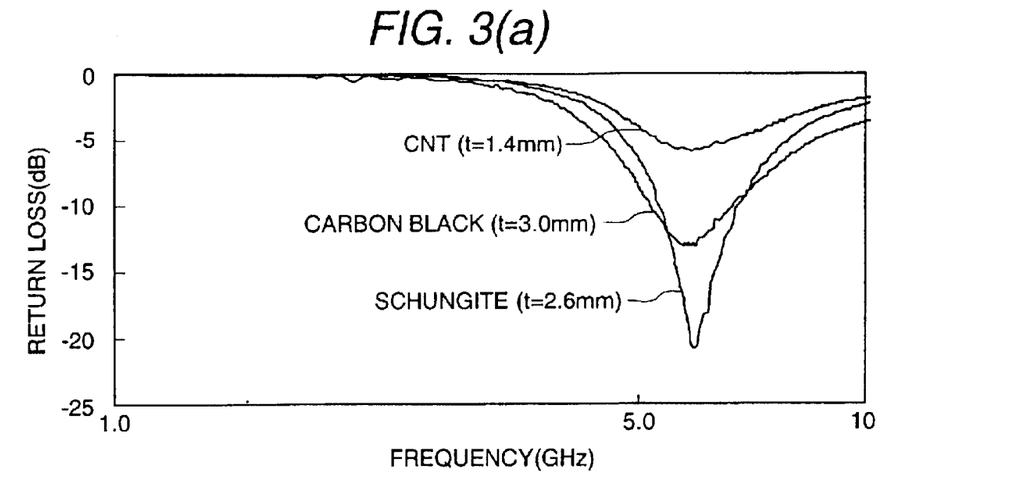
FIG. 3 is a graph to show calculation results for return losses for various materials at the same center frequency in return loss examination when they are metal-backed.
Figure 3B:
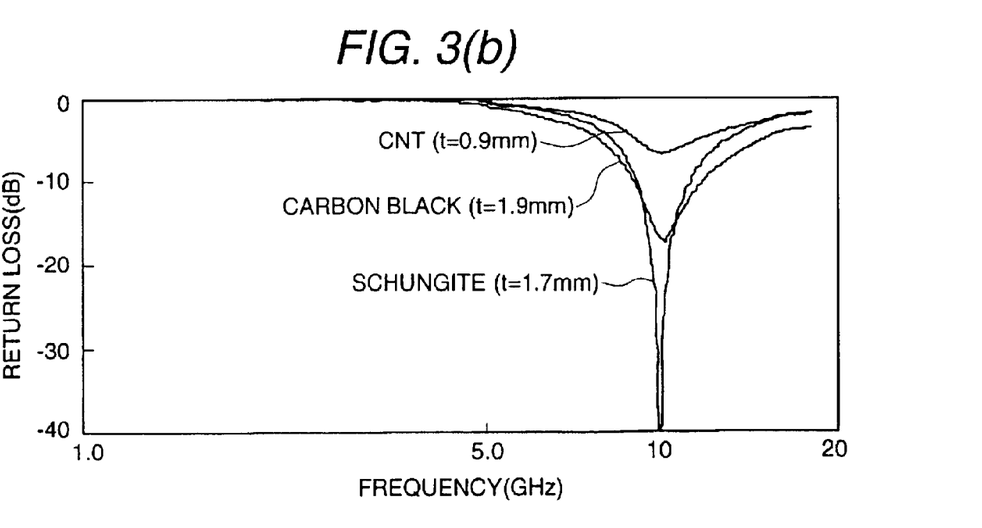

FIG. 3 is a graph to show comparison of thickness dependency of return losses in various electromagnetic wave absorption materials at the same center frequency for a return loss examination. The center frequency in the figure is 6 GHz in (a) and 10 GHz in (b). The thickness of each electromagnetic wave absorption material is also shown in the figure. In FIG. 3(a), at 6 GHz, CNT shows −6 dB of return loss, CB −13 dB, the schungite carbon −21 dB; and in FIG. 3(b), at 10 GHz, CNT shows −6 dB, CB −17 dB, the schungite carbon −40 dB. This shows that the schungite carbon has the largest return loss, i.e. the most excellent electromagnetic wave absorbing performance among these materials at both frequencies. In millimeter wave region, CNT and CB may be usable either they alone or in combination with the material by the present invention since they show acceptable performance in such region.

Figure 4A:
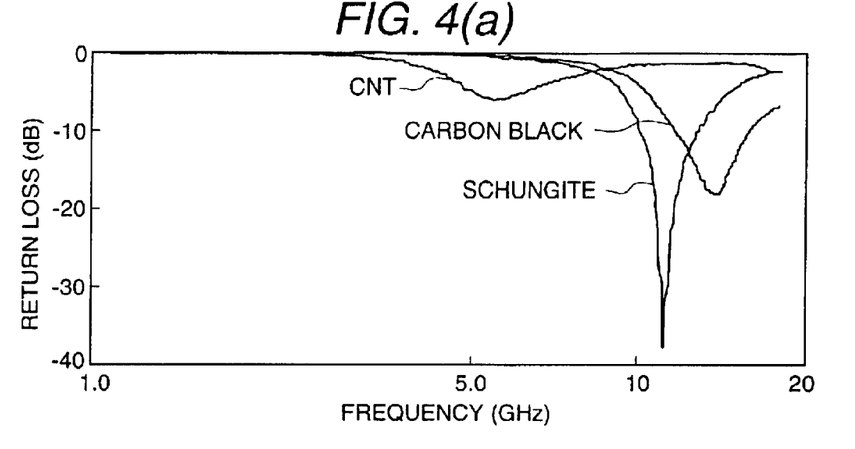
FIG. 4 is a graph to show calculation results for return losses for various thicknesses when they are metal-backed.
Figure 4B:
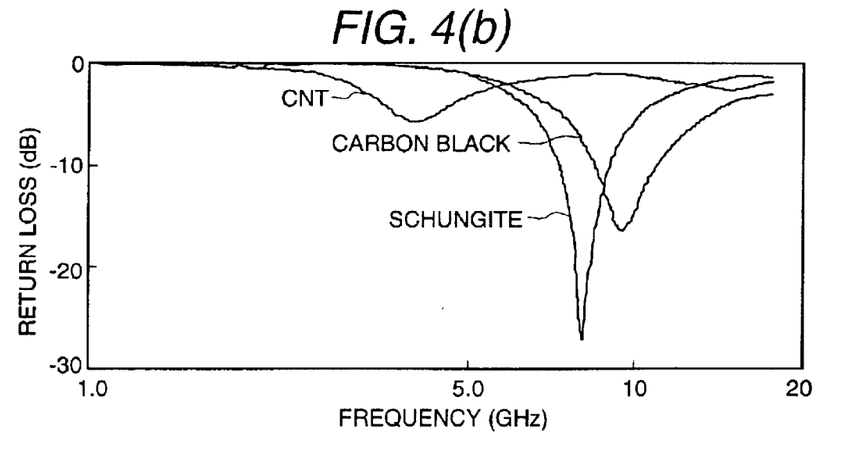
Figure 4C:
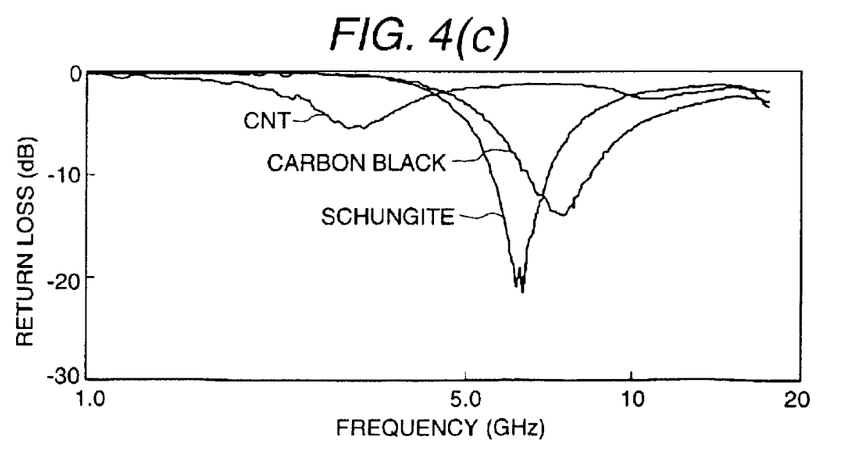

FIG. 4 is a graph to show calculation results of return losses for various electromagnetic wave absorption material in variety of thicknesses. Although the center frequencies of return losses differ each from other, the schungite shows the most excellent absorbing performance at every thickness. In each figure, (a) corresponds to thickness of 1.5 mm, (b) 2.0 mm, and (c) 2.5 mm.

The figure shows that, in (a) for the thickness of 1.5 mm, the return loss of CNT is −6 dB, CB −17 dB, the schungite carbon −40 dB; in (b) for 2.0 mm, CNT −6 dB, CB −17 dB, the schungite carbon −27 dB; and in (c) for 2.5 mm, CNT −6 dB, CB −14 dB, the schungite carbon −22 dB. These show that the schungite carbon has the largest return loss at every frequency indicating it has the most excellent electromagnetic wave absorbing performance. In millimeter wave region, CNT and CB may be usable either they alone or in combination with the material by the present invention since they show acceptable performance in such region.

Further, it is known from these that the material by the present invention which includes the schungite carbon has the return loss (reflection coefficient) of −3.5 dB per 1 GHz at 6 GHz of the radio wave frequency, and −4.0 dB at 10 GHz; and has the return loss of −20 dB or more at 6 GHz.

Embodiment 2

Figure 5:
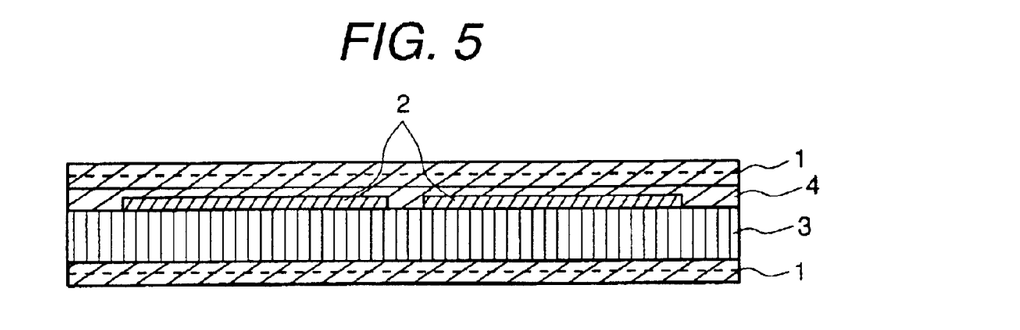
FIG. 5 is a cross sectional view of the printed wiring board equipped with an electromagnetic wave absorbing layer comprised of the electromagnetic wave absorption material by the present invention.

FIG. 5 is a cross sectional view of the printed wiring board equipped with an electromagnetic wave absorbing layer comprised of the electromagnetic wave absorption material by the present invention. A printed wiring board 3 comprised of a circuit wiring 2 formed on an insulator board has an insulting layer 4 on its one side of surface where said circuit wiring 2 is formed; and the other side, the reverse side thereto, has no wiring. On a part of said insulating layer 4 and on a part of said reverse side, or all of the both, a material comprised of ground powder of the natural schungite ore and a binder resin is applied to provide an electromagnetic wave absorbing layer thereon. This application is performed either by a direct coating of painting of said material or by providing a sheet of said material. The thickness of said coating or sheet is preferred to be 0.1 to 1.0 mm, though it may be designed otherwise depending on the frequency generated and the absorbing rate for electromagnetic wave. Thereby, generation of noise such as crosstalk phenomenon due to electromagnetic wave emitted from a printed wiring circuit is suppressed. Especially, high-density and high-integration will be realized with highly reliable manner in a multi-layer circuit wiring board which is comprised of a first wiring layer formed on at least one main side of surfaces of a semiconductor board, an insulating skin formed on the surface of said first wiring layer, and a second wiring layer electrically connected to said first wiring layer through a conducting hole on said insulating skin, said second layer being stacked repeatedly onto said first wiring layer. Arranging a conductive layer every outside of the electromagnetic wave absorbing layer will improve the absorption efficiency against electromagnetic and shielding effect against incoming electromagnetic wave from outside.

Embodiment 3

Figure 6A:
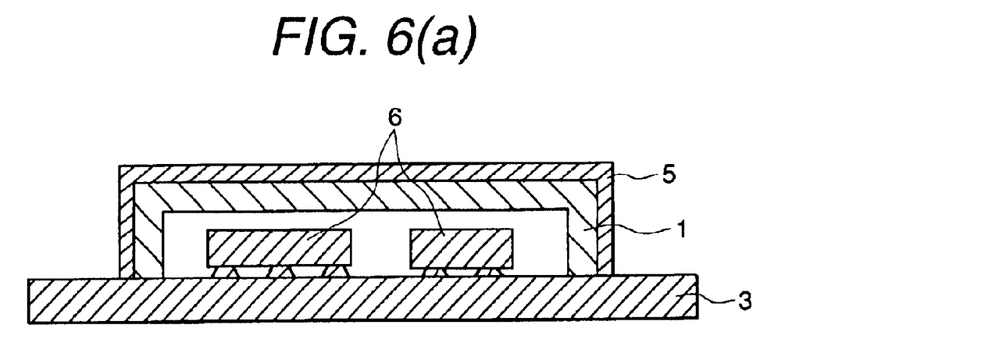
FIG. 6 is a cross sectional view of the electromagnetic wave absorbing cap arranged on a printed wiring board so that a semiconductor element that will generate noises may be enveloped thereby.
Figure 6B:
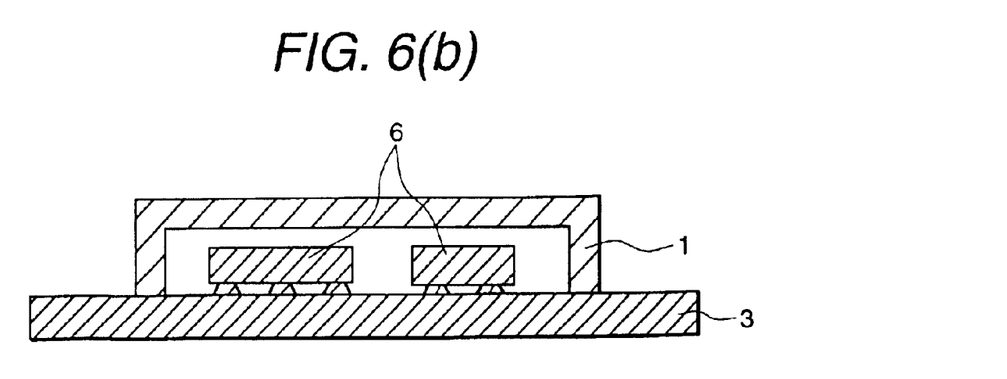

FIG. 6 is a cross sectional view of the electromagnetic wave absorbing cap for semiconductors arranged on a printed wiring board so that a semiconductor element that will generate noises may be enveloped thereby. This is to show a configuration of an arrangement of an electromagnetic wave absorbing cap, to which the present invention concerns, that is placed on a printed wiring board so that a possible noise generating source, such as a microprocessor or a system LSI, may be enveloped by said cap. FIG. 6(a) shows a configuration in which the electromagnetic wave absorbing layer by the present invention is arranged inside a metal cap 5 for shielding against electromagnetic wave coming from outside and for absorbing electromagnetic wave emitted from inside. The metal cap 5 uses copper plated material, copper and gold plated material, or stainless steel. FIG. 6(b) show a cap made by injection molding using electromagnetic wave absorption material by the present invention. An electromagnetic wave absorption material 1 formed into a cap is fixed on the printed wiring board 3 in hermetically, in glued, or in similar manner.

By these mounting practice, electromagnetic wave emitted from a semiconductor element is efficiently absorbed with suppressed inner interference.

Embodiment 4

Figure 7A:
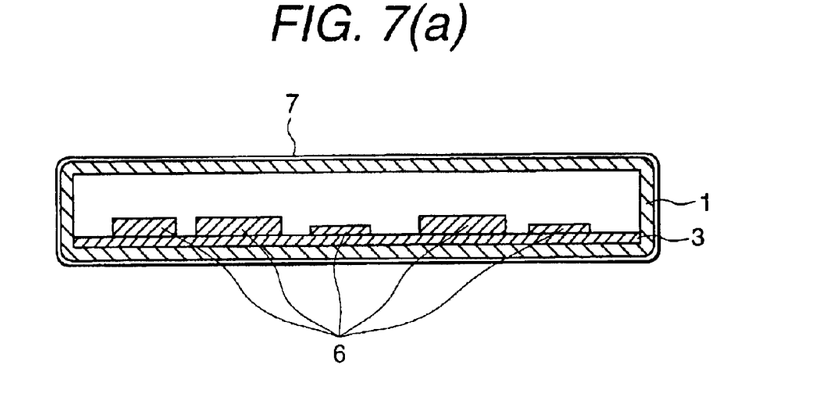
FIG. 7 is a cross sectional view of the casing for an electronic device comprised of the electromagnetic wave absorption material by the present invention.
Figure 7B:
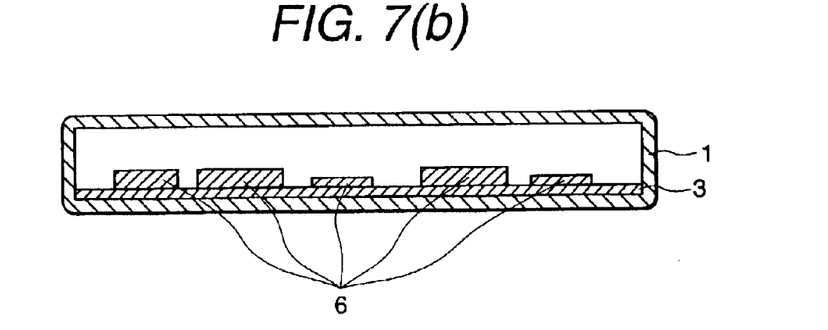

FIG. 7 is a cross sectional view of the electronic device, in which an IC 6 mounted on the printed wiring board 3 is sealed with an electronic device casing comprised of the electromagnetic wave absorbing material by the present invention. FIG. 7(a) shows an example wherein inside of a metal casing for an electronic device is provided with a layer of the electromagnetic wave absorption material by the present invention by coating or injection molding. FIG. 7(b) shows the electronic device casing formed by injection molding using the electromagnetic wave absorption material by the present invention. Thus, electromagnetic wave interference within an electronic device can be suppressed by giving the casing of devices an absorbing function against electromagnetic wave as shown in these examples.

Embodiment 5

Figure 8:
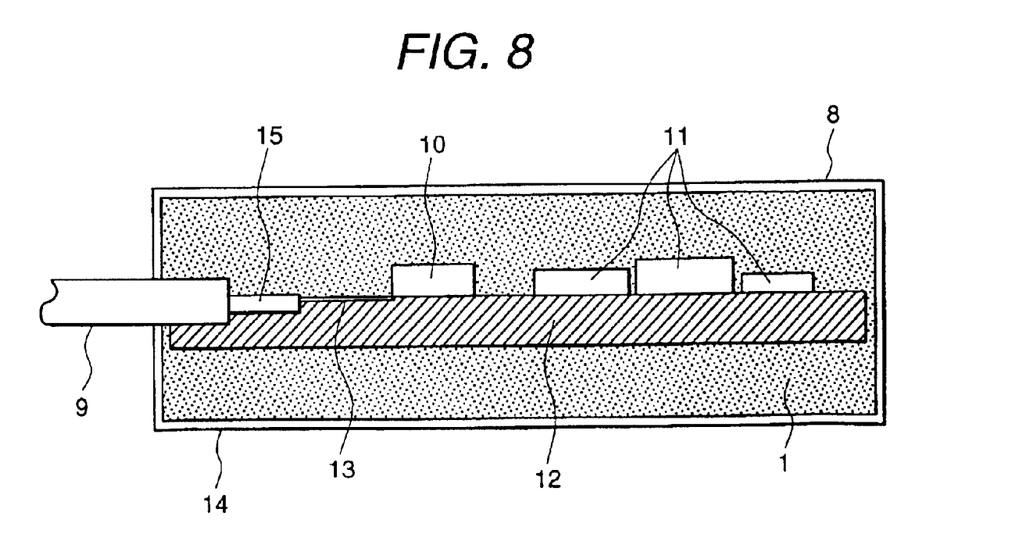
FIG. 8 is a cross sectional view of the optical transmission module in one embodiment of the present invention.

FIG. 8 is a cross sectional view of composition of the optical transmission module by the present invention. An optical transmission module 8 is comprised of a jacketed optical fiber 9, a light guide 13, an LD 10, a transmission circuit 11, and a circuit board 12. The transmission circuit 11 is further comprised of an LD driver, which drives the LD 10 as a light emitting diode, a laser output control unit, and a flip-plop circuitry. In practice, such configuration is accompanied by lead-frames and wires, which are omitted in the figures however. As the transmission speed increases, the clock frequency of electrical signal to excite the LD 10 becomes high causing emission of high-frequency electromagnetic wave inside the optical transmission module. This electromagnetic wave leads to noise, which adversely affects other elements and parts in the module.

In this embodiment, an optical transmission module is placed in a mold and is set by a resin-mix poured in a metal casing 14, then is metal-capped to provide a complete sealing over outside of said module with the metal casing 14, wherein said resin-mix is comprised of ground powder of said natural schungite ore equal to 40 to 80 wt-% of a resin being regulated depending on the above-mentioned frequency and the electromagnetic wave absorbing rate of said resin-mix. Thereby, not only protection of the element and board against moisture and gas but also absorbing and shielding of electromagnetic wave have been realized therein contributing suppression of noise interference in the transmission module together with complete prevention of noise emission to outside the module.

Figure 9:
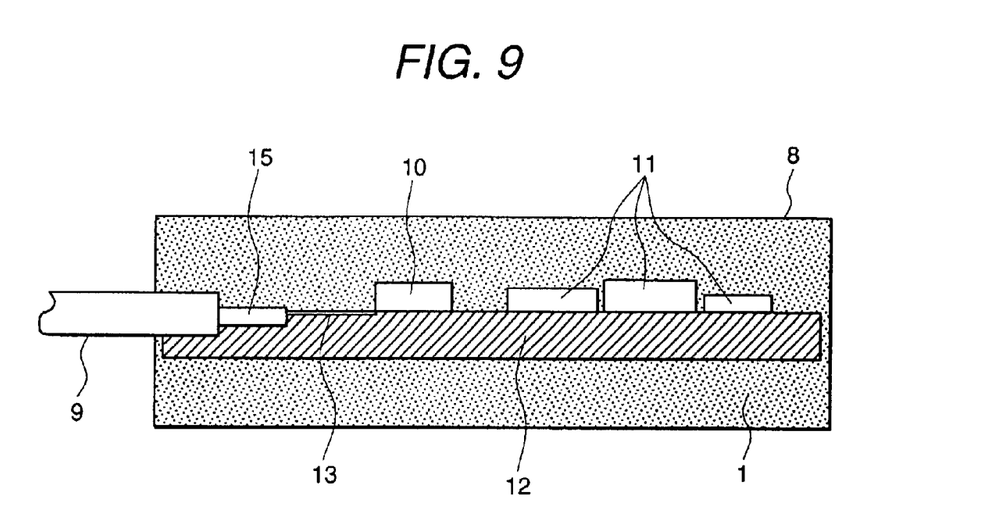
FIG. 9 is a cross sectional view of the optical transmission module, with its casing removed, in the embodiment of the present invention.

FIG. 9 is a cross sectional view of an optical transmission module. Since the metal casing 14 is not always required, a structure that is complete, as shown in FIG. 9, in being sealed with the resin-mix formed by a transfer molding is acceptable. This structure brings an advantage for lowered cost although absorbing and shielding effects against electromagnetic wave may be slightly degraded.

Figure 10:
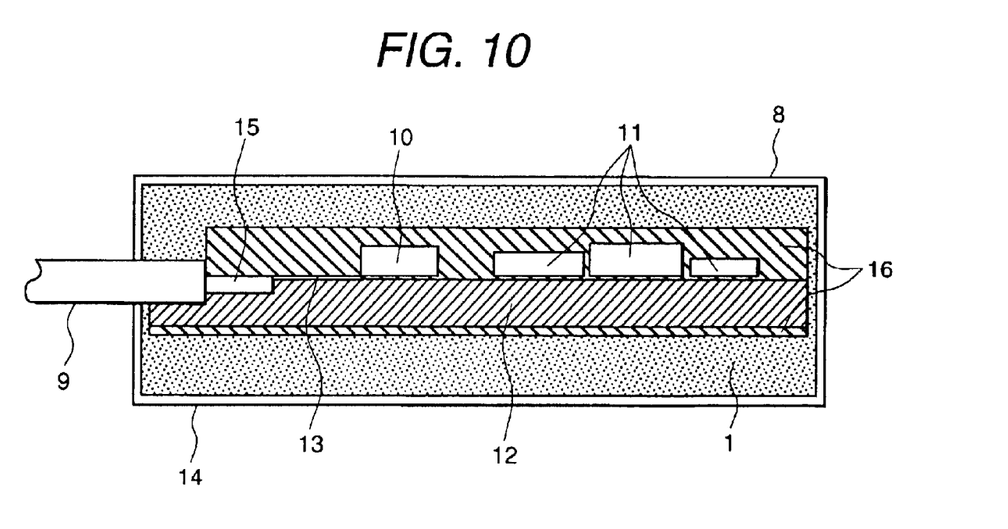
FIG. 10 is a cross sectional view of the 2-layer construction optical transmission module in the other embodiment of the present invention.

FIG. 10 is a cross sectional view of an optical transmission-reception module. For assured prevention of short circuit between wirings, a 2-layer construction, as shown in FIG. 10, is useful. The wiring part alone is first sealed with a resin that does not contain any of ground powder of the natural schungite ore; over which sealing by resin-mix containing ground powder of the natural schungite ore is provided to form said 2-layer construction.

In this embodiment, the LD 10 and the transmitter circuit 11 are shown. However, an optical reception module is also realized by replacing these units with a photo acceptance circuitry and a receiver circuitry respectively.

Embodiment 6

Figure 11:
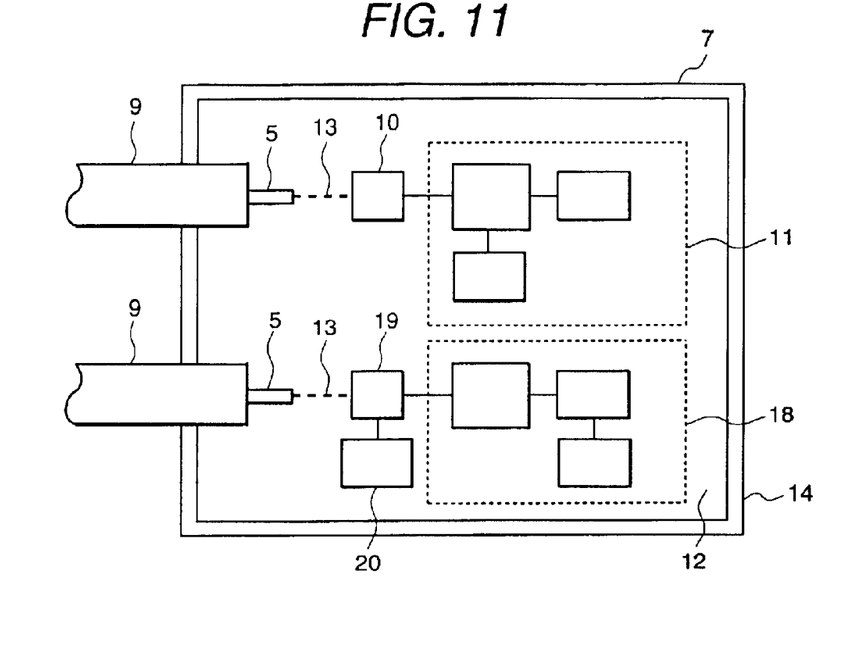
FIG. 11 is a plan view of the optical transmission-reception module in the first configuration of an optical transmission-reception module.

FIG. 11 is a plan view of the optical transmission-reception module in which an optical transmission module and an optical reception module are formed on the circuit board 12. An optical transmission-reception module 17 works both as an optical transmission module and an optical reception module. The optical transmission part is comprised of the jacketed optical fiber 9, the light guide 13, the LD 10, the transmitter circuit 11, and the circuit board 12. The transmitter circuit is comprised of an LD driver to drive a laser, a laser output control unit, and a flip-flop circuitry. The optical reception part is comprised of the jacketed optical fiber 9, the light guide 13, a PD 19, a receiver circuit 18, and the circuit board 12. The receiver circuit is comprised of the PRE-IC that has a pre-amplifying function, the CDRLSI composed of a clock extraction part and an equalizing amplifier, a SAW narrow band filter, and an AOD bias controlling circuitry. In practice, these configuration is accompanied by lead-frames and wires, which are omitted in the figures however.

As has been mentioned, the transmission-reception module, when a transmission module and a reception module are integrated therein, raises the inner noise interference problem caused from emitting-and-suffering of noise between its optical transmission unit and optical reception unit.

To prevent noise interference, the conventional optical transmission-reception module uses a metal shielding plate placed between the optical transmission unit and the optical reception unit or uses encapsulation of each module in a metal package to separate one into a transmission module and the other into a reception module. However, these constructions connect not only to a large and weighty module by the gross but also to being expensive because of use of a costly metal package. The construction according to the present invention not only prevents the noise interference within a module but also realizes miniaturization and price-reduction.

According to the present embodiment, it becomes practicable to provide equipment acceptable for use in a high speed telecommunication network, such as an optical transmission module, an optical reception module, or an optical transmission-reception module composed of an optical transmission unit and an optical reception unit; thanks to their capability rendered from the absorbing material to suppress internal noise interference and noise emission to outside, to achieve small-sizing and weight-reduction, to work under high speed transmission, and to have high sensitivity.

Embodiment 7

Figure 12:
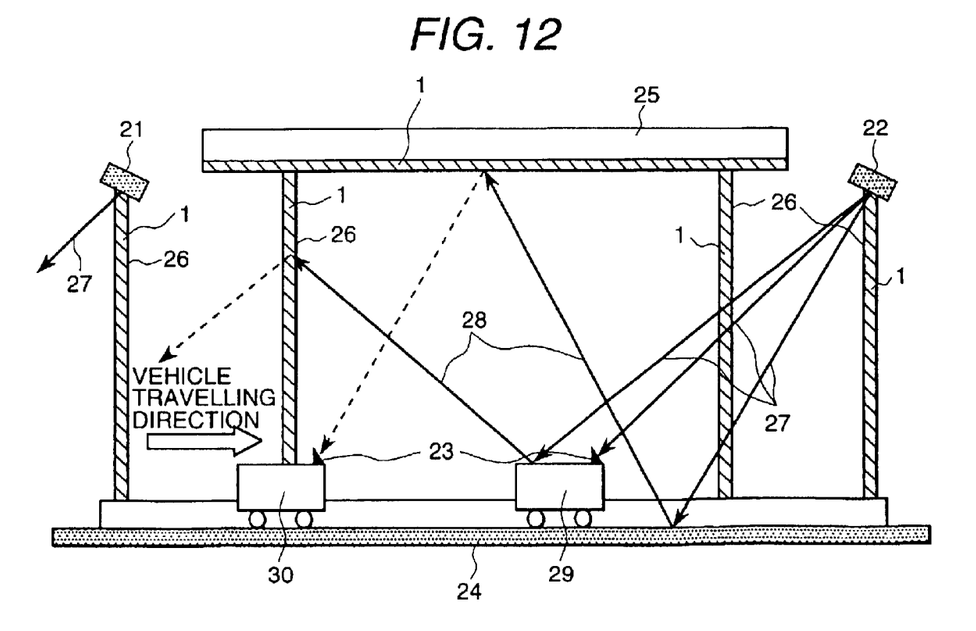
FIG. 12 is a cross sectional view to show figuration of the automated tollgate equipped with an electronic toll collection system (ETC), wherein the ceiling of the gate roof and supporting columns are applied with the electromagnetic wave absorption material by the present invention.

FIG. 12 is a cross sectional view to show a basic configuration of a tollgate equipped with an electronic toll collection system (ETC) that exchanges information between a roadside communication equipment and an on-vehicle equipment carried by a transit vehicle passing said tollgate.

As shown in FIG. 12, information required for toll collection is exchanged on a frequency 5.8 GHz among an entrance antenna 21, an exit antenna 22, and an on-vehicle equipment 23. A spread of the radio wave (a direct wave 27) transmitted from the exit antenna 22 broadens due to a multi-path reflection phenomenon caused by a road surface 24 and a ceiling or a supporting column of a gate roof 25. This causes a problem in discrimination of chained vehicles, wherein a reflected wave 28 reflected from the road surface 24 is received by other on-vehicle equipment carried by a following vehicle B 30 as shown in FIG. 12 although the radio wave transmitted form the exit antenna 22 (the direct wave 27) is received by the on-vehicle equipment carried by a vehicle A 29. Malfunctioning attributable to radio wave disturbance like interference to a vehicle on adjacent traffic lane is also further anticipation. These problems are solved by application of an electromagnetic wave absorption material on the surface of structural members, such as the ceiling of the gate roof 25 and supporting column that may reflect electromagnetic wave, so that the reflected wave 28 may be absorbed thereby. In this application, said electromagnetic wave absorption material is prepared and applied in a manner: i.e. a resin-mix containing ground powder of said natural schungite ore equal to 50 to 85 wt-% of the resin is made into either a liquid state using a solvent or a sheet, then the liquid state material is applied on the desired structural members and the sheeted material is glued on the same.

The radio wave absorbing material for ETC in the conventional technique is of a type integrated into one panel having a thickness of several tens of centimeters measuring much. This feature invites problems in installation such as difficulty in applying onto complicated shapes, which demands a paint type of or a flexible sheet type of thin electromagnetic wave absorption material layer. An electromagnetic wave absorption material 1 by the present invention is comprised of a resin-mix which contains ground powder of the natural schungite ore, which permits supplying in a paint or a flexible sheet depending on choice of resin to be used therein.

Figure 13:
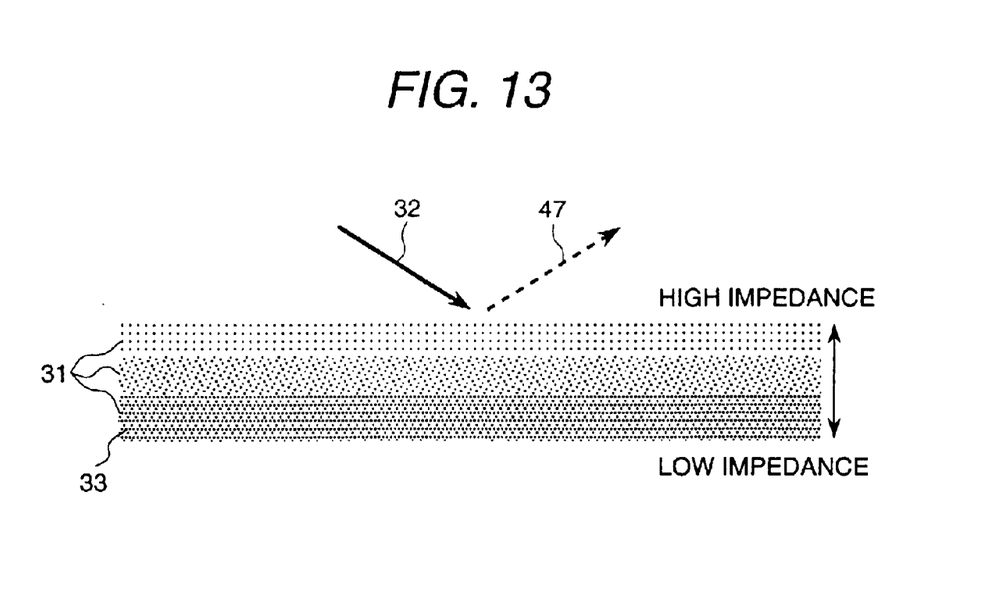
FIG. 13 is a cross sectional view of the multi-layer-structured radio wave absorber by the present invention.

A radio wave absorber 31 comprised of a resin-mix which contains ground powder of natural schungite ore should be formed in single layer or multi-layer structure as shown in FIG. 13. The multi-layer structure effectively improves absoring performance for an oblique incidence when layers are formed so that the characteristic impedance of the radio wave absorber to an incident wave 32 may gradually reduce toward a metal plate 33, a perfect reflector, from the incident plane of the radio wave. To realize this grading, a gradual increase of the complex relative dielectric constant toward the metal plate 33 from the incident plane of the radio wave is enough; this is attained by changing the filling ratio of ground powder of natural schungite ore to the resin. When the object to be applied is metal, the metal plate is not required. The radio wave absorber 31 shown in FIG. 13 is 3-layer.

If the filling ratio of the multi-layer hollow globule of carbon to resin in each layer is 5 weight-% or less, the complex relative dielectric constant is too small to obtain acceptable electromagnetic wave absorbing performance. Therefore, in conjunction with the viewpoint of securing the fluidity of resin-mix, this ratio in each layer is preferred to be 50 weight-% at the maximum or less.

Embodiment 8

Figure 14:
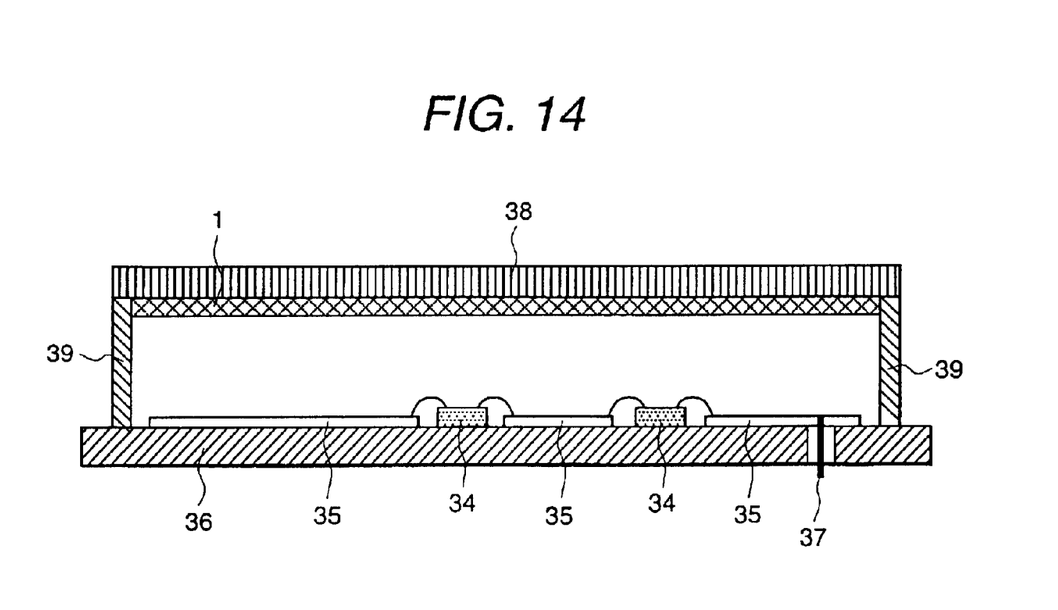
FIG. 14 is a cross sectional view of the millimeter wave transmission-reception apparatus in one embodiment of a high frequency communication equipment applied with the electromagnetic wave absorption material by the present invention.

FIG. 14 is a cross sectional view of the millimeter wave transmission-reception apparatus as an embodiment of a high frequency communication equipment. The flat-face-side of a semiconductor device 34 such as MMIC for transmission-reception use and a flat circuit board 35 that connects such semiconductor devices are mounted on a metallic base-plate 36, which is the bottom of a casing, to form a transmission-reception circuitry; an input-output signal is connected to an antenna (not illustrated) though a coaxial line 37. A metallic lid 38, being separated from the base-plate 36 by a sidewall 39 of the casing, forms a ceiling of the casing. The material of the sidewall of the casing can be any of metal, glass, alumina, and other nonmetals. The base-plate 36 is made of nonmetal like plastic or alumina, but a portion of the surface thereof on which the MMIC and the flat circuit board are mounted may be covered with metal formed by plating or deposition. The ceiling of the lid 38 that faces inside the casing is applied with a resin-mix containing ground powder of the natural schungite ore being prepared in a paint formula or in a sheet. The resin-mix in a paint formula is applied on said ceiling, and the one in a sheet is glued on the same. Thereby, undesirable emission from the transmission side of the transmission-reception circuitry straying within the casing is prevented from invading the reception side reducing mutual interference between transmission side and reception side.

What is claimed is:

1. Electromagnetic wave absorption material comprising a multi-layer hollow globule of carbon.

2. Electromagnetic wave absorption material according to claim 1, wherein said electromagnetic wave absorption material is further comprised of a substance that has an electrical resistivity higher than that of said multi-layer hollow globule and said electromagnetic wave absorption material is a composite of said substance.

3. Electromagnetic wave absorption material according to claim 2, wherein said high electrical resistivity substance contains at least one of rubber, insulating polymeric material, and inorganic insulating material.

4. Electromagnetic wave absorption material comprising a schungite carbon, wherein said schungite carbon contains at least one of a carbon nanotube formed therein, metallic constituent, and free water.

5. Electromagnetic wave absorption material according to claim 4, wherein said metallic constituent is comprised of one or more materials selected from the group of materials consisting of metals, metallic silicates, metallic sulfides, and metallic oxides.

6. Electromagnetic wave absorption material according to claim 5, wherein said metallic constituent is comprised of one or more materials selected from the group of materials consisting of Cu, Ni, V, Cr, Co, Mn, and Ti.

7. Electromagnetic wave absorption material comprising a multi-layer hollow globule of carbon, wherein said globule contains at least one of a carbon nanotube formed therein, metallic constituent, and free water.

8. Electromagnetic wave absorption material comprising a particulate of electromagnetic wave absorbing matter and a substance that has an electrical resistivity higher than that of said particulate of electromagnetic wave absorbing matter, wherein said electromagnetic wave absorption material has the radio wave return loss of not less than −3.5 dB per 1 GHz of frequency.

9. Electromagnetic wave absorption material comprising a particulate of electromagnetic wave absorbing matter and a substance that has an electrical resistivity higher than that of said particulate of electromagnetic wave absorbing matter, wherein said electromagnetic wave absorption material has the radio wave return loss of not less than −20 dB at a frequency of 6 GHz.

10. A high frequency communication equipment comprising a high frequency circuit element mounted and accommodated inside a casing, wherein at least the inner wall of said casing and at least a part of said inner wall are provided with the electromagnetic wave absorption material described in claim 9.

11. Electromagnetic wave absorption material according to claim 9, wherein said high electrical resistivity substance contains at least one of rubber, insulating polymeric material, and inorganic insulating material.

12. Electromagnetic wave absorption material according to claim 9, wherein the content of said particulate of electromagnetic wave absorbing matter is 5 to 50 weight-% of the whole weight of said electromagnetic wave absorption material.

13. Electromagnetic wave absorption material according to claim 9, wherein content of said particulate of electromagnetic wave absorbing matter is graded to plural degrees so that characteristic impedance may reduce toward inside from the incident plane of electromagnetic wave.

14. Electromagnetic wave absorption material according to claim 9, wherein said absorption material further includes any one of: a magnetic metal of which main constituent is at least one of Fe, Co, and Ni; a compound selected from the group consisting of an oxide, a nitride, and a carbide, in which their main constituent is at least one of Fe, Co, Ni, Al, Si, Ti, Ba, Mn, Zn, and Mg; or a carbon-based substance which contains at least one of carbon black, graphite, coke, and carbon micro-coil.

15. A printed wiring board comprising an insulated board having a circuit wiring thereon, said circuit wiring being at least partly covered with an insulating layer, wherein at least one of surfaces of said insulated board, one surface having said wiring circuit thereon and the other the reverse surface thereof, has a layer comprised of an electromagnetic wave absorption material, which is the electromagnetic wave absorption material described in claim 9.

16. An electronic device comprising an electronic element mounted on a printed wiring board, said electronic element being covered with a metal cap, wherein at least a part of internal surface of said metal cap is provided with an electromagnetic wave absorption material, which is the electromagnetic wave absorption material described in claim 9.

17. An electronic device comprising a printed wiring board, an electronic device mounted on said printed wiring board, said printed wiring board and said electronic device being covered with a metal casing, wherein at least a part of internal surface of said metal casing is provided with an electromagnetic wave absorption material, which is the electromagnetic wave absorption material described in claim 9.

18. A metal casing having an opening, wherein at least a part of internal surface of said metal casing is provided with the electromagnetic wave absorption material described in claim 9.

19. A module of optical transmission or of optical reception comprising a circuit board having at least either a light emitting element or a photo acceptance element and having at least either a transmission circuitry or a reception circuitry thereon, wherein at least a part of said circuit board, said element, and said circuitry are covered with the electromagnetic absorption material described in claim 9.

20. A module of optical transmission or of optical reception according to claim 19, wherein at least a part of said circuit board, said elements, and said circuitry are covered with an insulating resin, the surface of said insulating resin is provided with said electromagnetic absorption material.

21. A module of optical transmission or of optical reception comprising a circuit board having at least either a light emitting element or a photo acceptance element and having at least either a transmission circuitry or a reception circuitry thereon, wherein at least a part of said circuit board, said elements, and said circuitry are covered with an element having the electromagnetic absorption material described in claim 9, and external surface of said element is covered with a metal cap.

22. A module of optical transmission or of optical reception comprising a circuit board having at least either a light emitting element or a photo acceptance element and having at least either a transmission circuitry or a reception circuitry thereon, wherein at least a part of said circuit board, said elements, and said circuitry are covered with a metal cap, and at least a part of internal surface of said metal cap is formed by an element having the electromagnetic absorption material described in claim 9.

23. An automated tollgate comprising a roofed tolling gate, an entrance antenna arranged at the entrance of said tolling gate and faced to a transit vehicle approaching said tolling gate, an exit antenna arranged at the exit of said tolling gate and faced to a transit vehicle leaving said tolling gate, and an automated toll collection system that exchanges information between a roadside communication equipment and an on-vehicle equipment carried by said transit vehicle, wherein the surface of a structural member in said tolling gate and its vicinity which reflects electromagnetic wave, the surface of facing-to-vehicle side of the roof of said tolling gate, and at least a part of the surface of a supporting column for said entrance antenna and said exit antenna are provided with the electromagnetic wave absorption material described in claim 9.

* * * * *